(12) United States Patent
Jeon et al.

(10) Patent No.: US 7,697,336 B2
(45) Date of Patent: Apr. 13, 2010

(54) NON-VOLATILE MEMORY DEVICE AND METHOD OF OPERATING THE SAME

(75) Inventors: Chang-Min Jeon, Yongin-si (KR);
Hee-Seog Jeon, Suwon-si (KR);
Hyun-Khe Yoo, Suwon-si (KR);
Sung-Gon Choi, Osan-si (KR);
Bo-Young Seo, Suwon-si (KR); Ji-Do Ryu, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 110 days.

(21) Appl. No.: 11/903,482

(22) Filed: Sep. 21, 2007

(65) Prior Publication Data
US 2008/0253190 A1  Oct. 16, 2008

(30) Foreign Application Priority Data
Sep. 22, 2006  (KR)  ............ 10-2006-0092508

(51) Int. Cl.
*G11C 11/34* (2006.01)
(52) U.S. Cl. .................. 365/185.18; 365/185.24
(58) Field of Classification Search ............ 365/185.18, 365/185.24
See application file for complete search history.

(56) References Cited

U.S. PATENT DOCUMENTS

| | | | |
|---|---|---|---|
| 6,188,608 B1 | 2/2001 | Maruyama et al. | |
| 6,510,081 B2 | 1/2003 | Blyth et al. | |
| 7,006,381 B2 | 2/2006 | Dormans et al. | |
| 7,184,308 B2 | 2/2007 | Kwon et al. | |
| 2002/0114185 A1 | 8/2002 | Blyth et al. | |
| 2005/0052918 A1* | 3/2005 | Dormans et al. | 365/222 |
| 2005/0056869 A1 | 3/2005 | Ichige et al. | |
| 2005/0110073 A1 | 5/2005 | Spadea | |
| 2005/0117399 A1 | 6/2005 | Kwon et al. | |
| 2005/0237803 A1* | 10/2005 | Takase et al. | 365/185.11 |
| 2006/0284236 A1* | 12/2006 | Bhattacharyya | 257/314 |
| 2007/0047327 A1* | 3/2007 | Goda et al. | 365/185.29 |

FOREIGN PATENT DOCUMENTS

| | | |
|---|---|---|
| KR | 2001-0045232 | 6/2001 |
| KR | 10-2004-0068552 | 7/2004 |
| KR | 10-2005-0016108 | 2/2005 |
| WO | WO 03/047163 A2 | 6/2003 |

* cited by examiner

*Primary Examiner*—Michael T Tran
(74) *Attorney, Agent, or Firm*—Mills & Onello, LLP (57) ABSTRACT

The present invention is directed to a non-volatile memory device and a method of operating the same. The non-volatile memory device includes a first transistor connected to an nth bitline and a second transistor connected to an (n+1)th bitline. The first transistor and the second transistor are serially coupled between the nth bitline and the (n+1)th bitline. The non-volatile memory device may include a 2-transistor 1-bit unit cell where a drain region and a source region of a memory cell have the same or similar structure. Since a cell array of a non-volatile memory device according to the invention may include a 2-transistor 2-bit unit cell, storage capacity of the non-volatile memory device may be doubled.

17 Claims, 5 Drawing Sheets

NON-VOLATILE MEMORY DEVICE AND METHOD OF OPERATING THE SAME

CROSS-REFERENCE TO RELATED APPLICATIONS

This U.S. non-provisional patent application claims priority under 35 U.S.C. § 119 to Korean Patent Application 10-2006-0092508 filed in the Korean Intellectual Property Office on Sep. 22, 2006, the entirety of which is hereby incorporated by reference.

BACKGROUND

The present invention relates to semiconductor devices and methods of operating the same. More specifically, the present invention is directed to non-volatile memory devices and methods of operating the same.

Semiconductor memory devices require various characteristics such as high speed operation, low power dissipation, random access, and high capacity storage determined according to devices and systems in which they are applied. Among non-volatile memory devices, a 2-transistor FN tunneling type EEPROM cell has an array structure which is able to write/erase byte data. Therefore, the 2-transistor FN tunneling type EEPROM cell is being widely used as a data access type and data storage type memory device.

A unit cell of an EEPROM cell includes a memory cell transistor and a selection transistor. Accordingly, the EEPROM cell has disadvantages such as a larger area occupied by the unit cell and a lower integration density than a flash memory device. Similar to a flash memory device, an FN tunneling type EEPROM cell includes a FLOTOX-type memory cell transistor and has a structure in which a selection transistor is serially connected to the FLOTOX-type memory cell transistor. Conventionally, a memory cell transistor and a selection transistor are different in channel length, and a portion of a gate insulator of the memory cell transistor has a tunnel insulator structure.

In recent years, an EEPROM cell has been introduced in which a memory cell transistor and a selection transistor have a minimum-sized channel length to enhance an integration density. However, a conventional EEPROM cell experiences leakage current and increased resistance caused by a common source region because the common source region and a drain region are different in configuration.

SUMMARY OF THE INVENTION

According to a first aspect, the present invention is directed to a non-volatile memory device. The device includes a first transistor connected to an nth bitline and a second transistor connected to an (n+1)th bitline. The first and second transistors are serially coupled between the nth bitline and the (n+1)th bitline, and at least one of the first and second transistors is a memory cell transistor.

In one embodiment, the non-volatile memory device includes a first gate line connected to a gate electrode of the first transistor and a second gate line connected to a gate electrode of the second transistor. The first gate line and second gate line can be arranged to cross the nth bitline and the (n+1)th bitline. The first gate line can be connected to gate electrodes of first transistors connected to a plurality of bitlines, and the second gate line can be connected to gate electrodes of second transistors connected to a plurality of bitlines.

In one embodiment, a plurality of first transistors and a plurality of second transistors are arranged between the nth bitline and the (n+1)th bitline.

The memory cell transistor can include a data storage element having a charge trapping structure.

The memory cell transistor can include a data storage element having a floating gate structure.

In one embodiment, the first and second transistors are disposed at a first-conductivity-type well surrounded by a second-conductivity-type well.

According to another aspect, the present invention is directed to a non-volatile memory device. The device includes a plurality of active regions extending on a semiconductor substrate in a column direction. A plurality of gate line sets extend over the active regions in a row direction, the gate line sets each comprising a first gate line and a second gate line which are parallel with each other. The device also includes bitline contacts each being formed at the active regions between the gate line sets. A bitline crosses over the gate line sets and is alternately connected to the bitline contacts formed at two adjacent active regions.

In one embodiment, the device further includes a data storage element interposed between the first gate line and the active region.

In one embodiment, the device further includes a data storage element interposed between the first gate line and the active region and between the second gate line and the active region.

In one embodiment, the data storage element is a floating gate.

In one embodiment, the data storage element is a charge trap insulator.

In one embodiment, the bitline is zigzag-shaped.

According to another aspect, the invention is directed to a method of operating a non-volatile memory device comprising a first transistor connected to an nth bitline and a second transistor connected to an (n+1)th bitline, wherein the first and second transistors are serially coupled between the nth bitline and the (n+1)th bitline, and at least one of the first and second transistors is a memory cell transistor. According to the method, a program method of the first transistor comprises: applying a positive program voltage to a gate of the first transistor; applying a negative program inhibit voltage to a gate of the second transistor; applying a negative program voltage to the nth bitline; floating the (n+1)th bitline; and applying a negative program voltage to a substrate.

In one embodiment, a program method of the second transistor comprises: applying a positive program voltage to a gate of the second transistor; applying a negative program inhibit voltage to a gate of the first transistor; applying a negative program voltage to the (n+1)th bitline; floating the nth bitline; and applying a negative program voltage to a substrate.

In one embodiment, a read method of the first transistor comprises: applying a positive read voltage to the first transistor; applying a positive pass voltage to the second transistor; applying a reference voltage to the nth bitline; and applying a ground voltage to the (n+1)th bitline.

In one embodiment, a read method of the second transistor comprises: applying a positive read voltage to the second transistor; applying a positive pass voltage to the first transistor; applying a reference voltage to the (n+1)th bitline; and applying a ground voltage to the nth bitline.

In one embodiment, a charge storage element is interposed between the substrate and the gate of the first transistor, and a gate insulator is interposed between the substrate and the gate of the second transistor.

In one embodiment, a charge storage element is interposed between the substrate and the gate of the first transistor and between the substrate and the gate of the second transistor.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. It will also be understood that when a layer is referred to as being "on" another layer or substrate, it can be directly on the other layer or substrate, or intervening layers may also be present.

Figure 1:
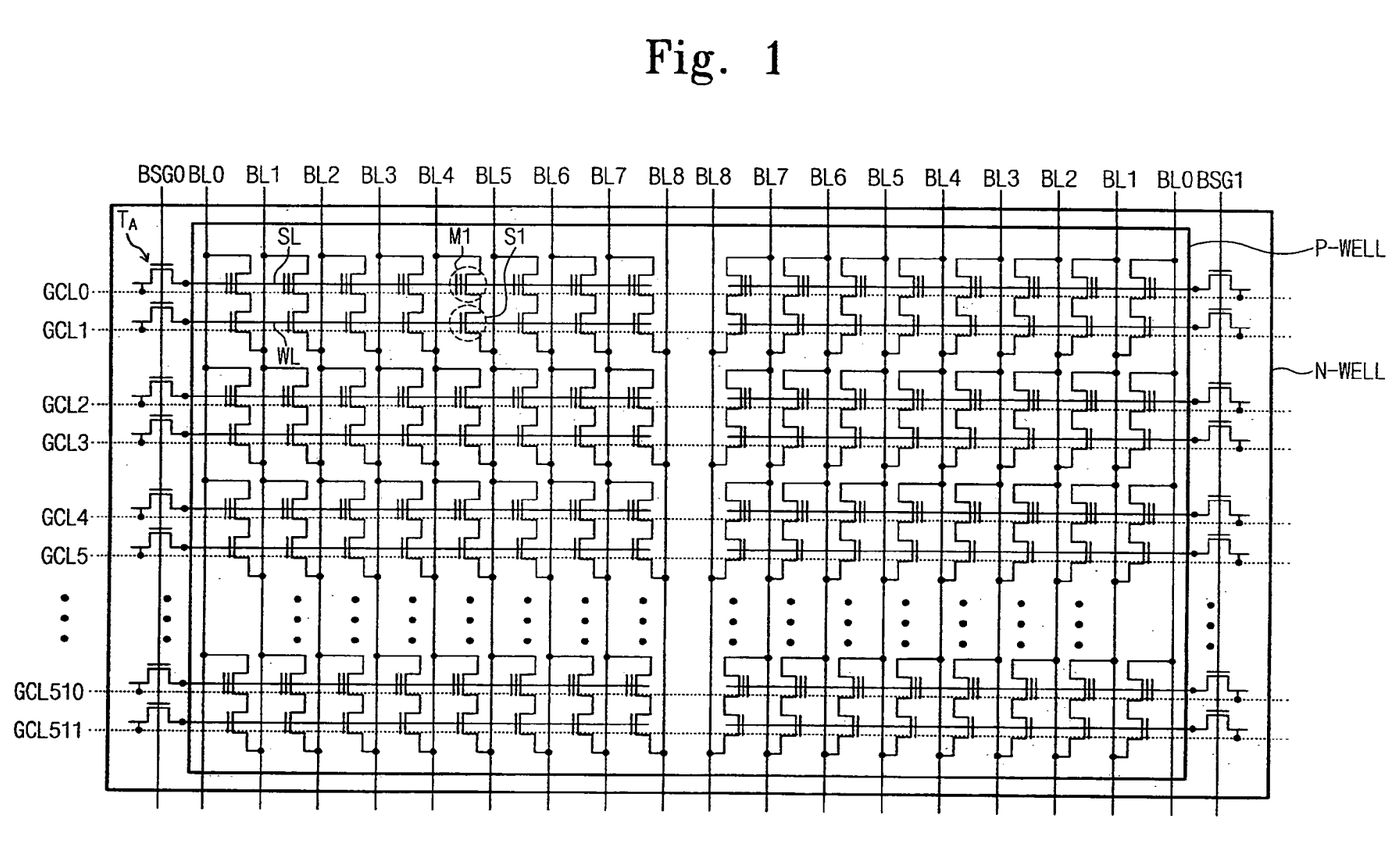
FIG. 1 is an equivalent circuit diagram of a non-volatile memory device according to a first embodiment of the present invention.

FIG. 1 illustrates a cell array of a non-volatile memory device according to a first embodiment of the present invention. In the cell array, transistors M1 and S1 are disposed at a P-well surrounded by an N-well. A unit cell includes first transistors M1 and second transistors S1, which are serially connected to each other. A plurality of unit cells are arranged in the cell array. The first cell transistors M1 are connected to each other in a row direction to constitute a first gate line SL, and the second cell transistors S1 are connected to each other in a row direction to constitute a second gate line WL which is parallel with the first gate line SL. Gate line sets each comprising a first gate line SL and a second gate line WL are arranged in the cell array. Each of gate lines SL and WL is connected to a column selection line GCLn by a column selection transistor $T_A$.

A plurality of bitlines BLn are arranged to cross the first gate line SL and the second gate lines WL. The unit cell is coupled between an nth bitline and an (n+1)th bitline. The first transistor M1 is connected to the nth bitline, and the second transistor S1 is connected to the (n+1)th bitline. Thus, the first transistor M1 and the second transistor S1 are serially coupled between the nth bitline and the (n+1)th bitline.

In the above structure, eight transistors are connected to one gate line to enable a byte operation to be conducted in response to the selection of a gate line and a bitline. However, the number of operation bits may vary with the number of transistors connected to the gate line.

In this embodiment, the first transistor M1 may be a memory cell transistor and the second transistor S1 may be a selection transistor. The first gate line SL may be a sensing line, and the second gate line WL may be a wordline. In an EEPROM cell, the memory cell transistor includes a charge storage element. The charge storage element may be a floating gate under a FLOTOX structure and be a charge trap insulator under a charge trapping structure.

In this embodiment, a cell array structure does not use a common source line of an impurity diffusion structure formed on a substrate and a bitline wiring may be connected to both ends of the unit cell. Accordingly, resistance may decrease to improve signal transmission speed, and impurity diffusion layers of the unit cells may be separated from each other to suppress leakage current.

Figure 2:
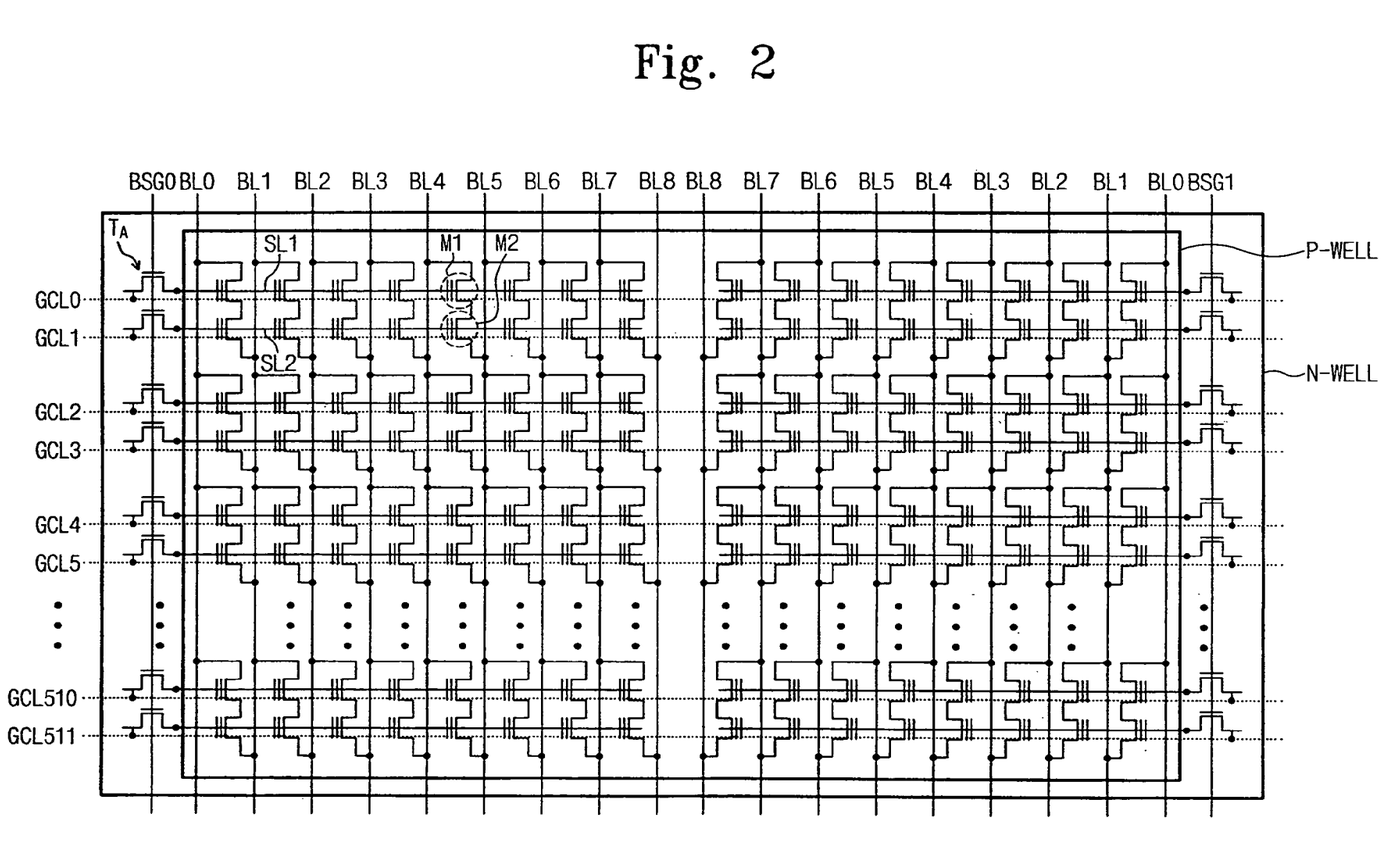
FIG. 2 is an equivalent circuit diagram of a non-volatile memory device according to a second embodiment of the present invention.

FIG. 2 is an equivalent circuit diagram of a non-volatile memory device according to a second embodiment of the present invention. In the embodiment of FIG. 2, a cell array structure has increased memory capacity over that of the embodiment of FIG. 1. Referring to FIG. 2, in a cell array of the non-volatile memory device, transistors M1 and M2 are arranged at a P-well surrounded by an N-well. A unit cell includes a first transistor M1 and a second transistor M2. A plurality of unit cells are arranged in the cell array. In the cell array, the first transistors M1 are connected to each other in a row direction to constitute a first gate line SL1 and the second transistors M2 are connected to each other in the row direction to constitute a second gate line SL2. Gate line sets each comprising the first gate line SL1 and the second gate line SL2 are arranged in the cell array. Each of gate lines SL1 and SL2 is connected to a column selection line GCLn by a column selection transistor $T_A$.

A plurality of bitlines BLn are arranged to cross the first gate lines SL1 and the second gate lines SL2. The unit cell is coupled between an nth bitline and an (n+1)th bitline. The first transistor M1 is connected to the nth bitline, and the second transistor M2 is connected to the (n+1)th bitline. Thus, the first transistor M1 and the second transistor M2 are serially coupled between the nth bitline and the (n+1)th bitline.

In the above structure, eight transistors are connected to one gate line to enable a byte operation to be conducted in response to the selection of a gate line and a bitline. However, the number of operation bits may vary with the number of transistors connected to the gate line.

In this embodiment, each of the first transistor M1 and the second transistor M2 may be a memory cell transistor. When the first transistor M1 is selected under bias condition, the second transistor M2 may act as a selection transistor. When the second transistor M2 is selected under bias condition, the first transistor M1 may act as the selection transistor. Thus, a 2-transistor 2-bit unit cell may be achieved by storing data in the first and second transistors M1 and M2.

Figure 3:
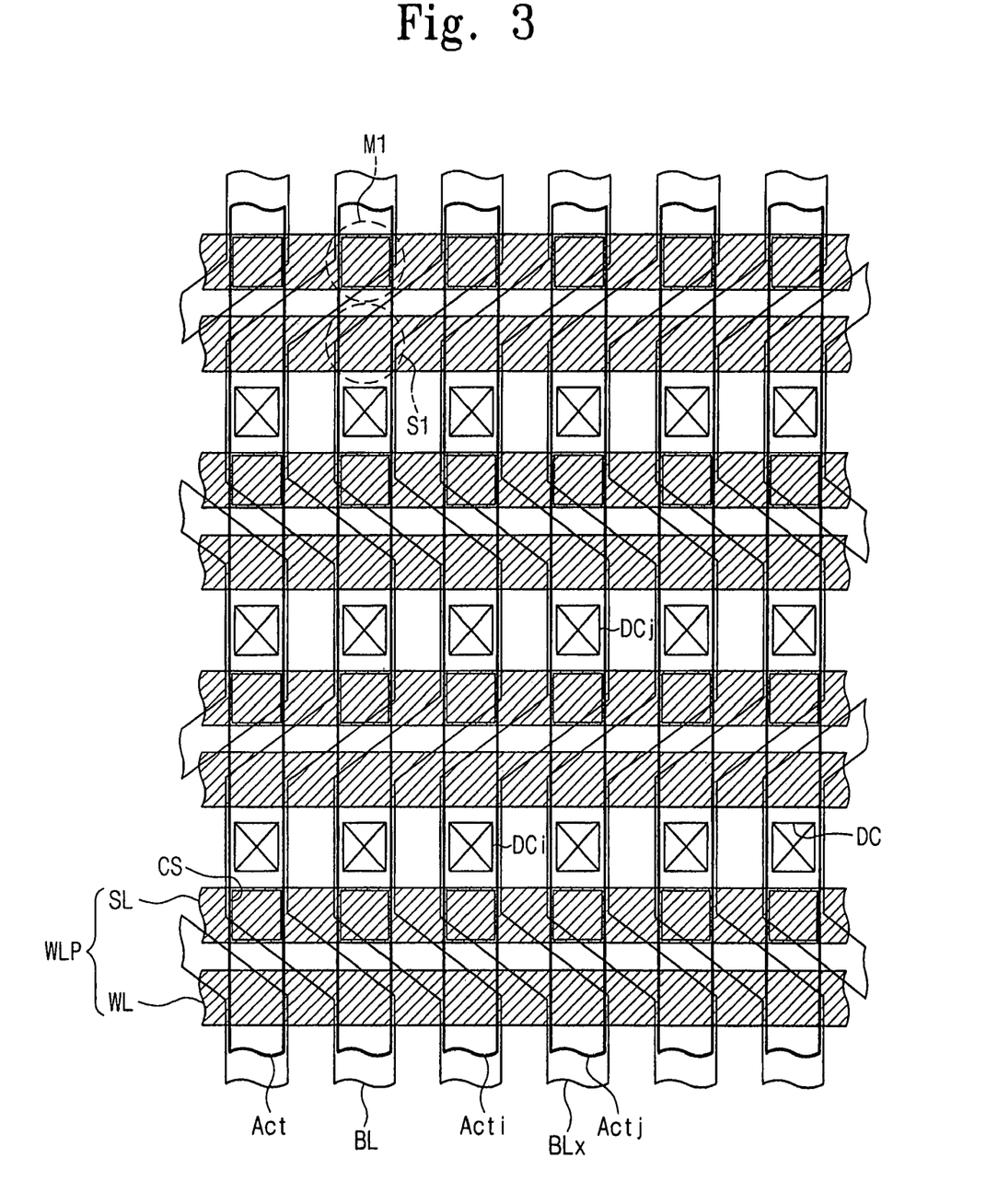
FIG. 3 is a top plan view of a non-volatile memory device according to a first embodiment of the present invention.

FIG. 3 is a top plan view of a non-volatile memory device according to a first embodiment of the present invention. The non-volatile memory device includes a plurality of active regions Act formed on a semiconductor substrate to run parallel in a column direction. A plurality of gate lines are arranged to cross over the active regions Act. The gate lines may be divided into a first gate line SL and a second gate line WL. The first gate line SL and the second gate line WL constitute a gate line set WLP. The first gate line SL is a sensing line where memory cell transistors M1 are connected to each other in a row direction, and the second gate line WL is a wordline where selection transistors S1 are connected to each other in a row direction. The memory cell transistor M1 is formed at the intersection of the first gate line SL and the active region Act. The memory cell transistor M1 includes a charge storage CS, which is interposed between the first gate line SL and the active region Act. The charge storage CS may be a floating gate or a charge trapping insulator.

Accordingly, a tunnel insulator floating gate and an intergate dielectric may be interposed between the first gate line SL and the active region Act, and a gate insulator may be interposed between the second gate line WL and the active region Act.

A plurality of gate line sets WLP are arranged to cross over the active regions Act. A bitline contact DC is connected to the active region Act between the gate line sets WLP. A bitline BLx is disposed to cross over the gate line sets WLP. The bitline BLx is electrically connected to two adjacent active regions Acti and Actj. As illustrated in the figure, the bitline BL is alternately connected to bitline contacts DC formed at two adjacent active regions Acti and Actj, i.e., a first bitline contact DCi and a second bitline contact DCj. Thus, the bitline BL extends in a zigzag configuration over the gate lines as shown.

Although not illustrated in the figure, impurity-doped layers may be formed at the active regions Act adjacent to opposite sides of the gate line sets WLP to be a source and a drain, respectively. In addition, the impurity-doped layer may be formed at the active region Act between the first gate line SL and the second gate line WL to be a floating diffusion layer.

According to the present invention, the active regions Act may be arranged at regular pitches with minimum feature size and the bitline BL is arranged in a zigzag configuration. Thus, the source and the drain may have the same structure without increasing the area of a cell array. As a result, increase of leakage current and resistance through a source region is lower than in a conventional non-volatile memory device where a common source line is formed.

Figure 4:
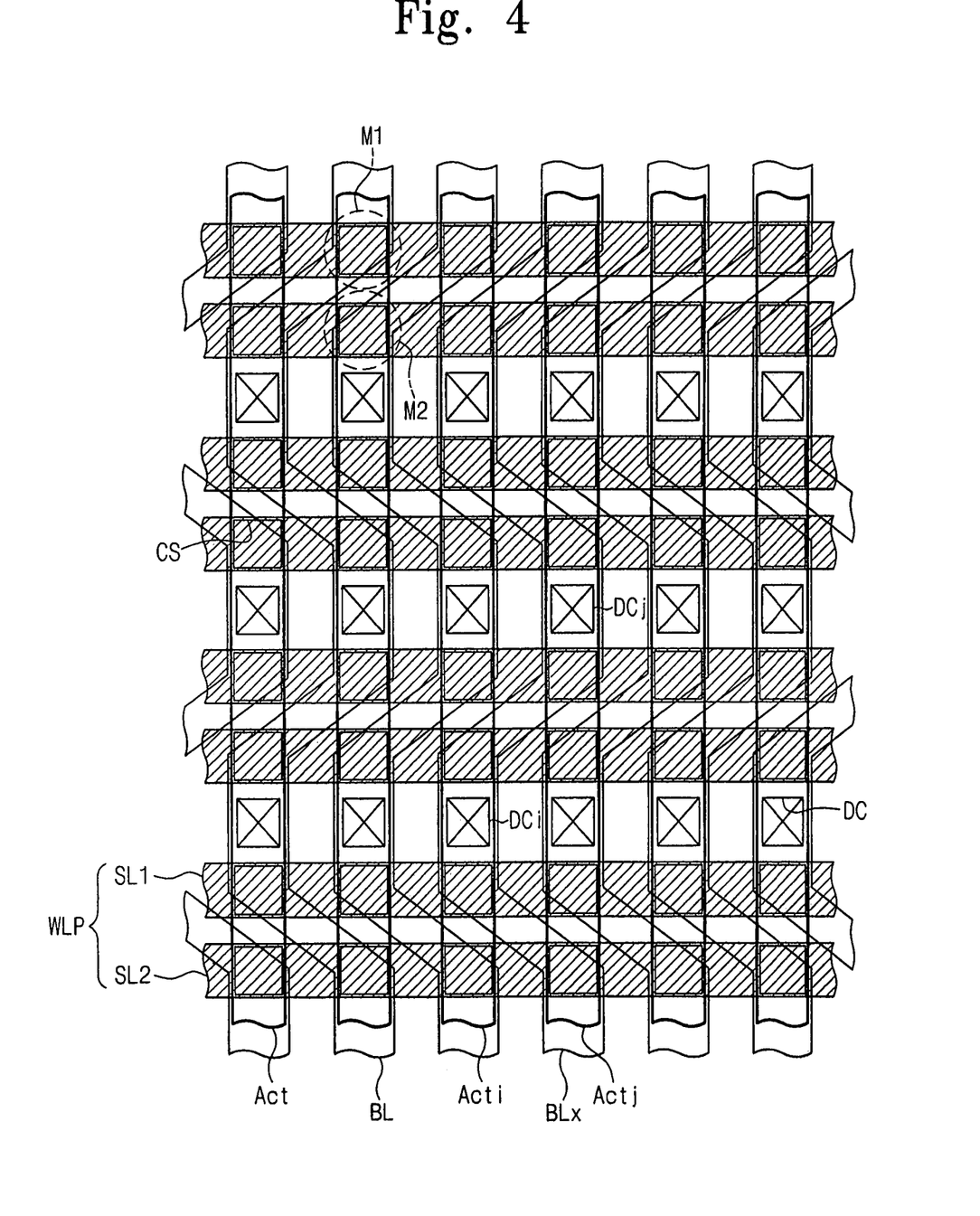
FIG. 4 is a top plan view of a non-volatile memory device according to a second embodiment of the present invention.

FIG. 4 is a top plan view of a non-volatile memory device according to a second embodiment of the present invention. The non-volatile memory device includes a plurality of active regions Act arranged on a semiconductor substrate to run parallel in a column direction. A plurality of gate lines are arranged to cross over the active regions Act. The gate lines may be divided into a first gate line SL1 and a second gate line SL2, which constitute a gate line set WLP. The first gate line SL1 is a first sensing line where first memory cell transistors M1 are connected to each other in a row direction, and the second gate line SL2 is a second sensing line where second memory cell transistors M2 are connected to each other in a row direction. A charge storage CS is interposed between the first gate line SL1 and the active region Act and between the second gate line SL2 and the active region Act. When the first memory cell transistor M1 is selected as a memory cell, the first sensing line acts as a sensing line and the second sensing line acts as a wordline and the second memory cell transistor M2 acts as a selection transistor. When the second memory cell transistor M2 is selected as a memory cell, the second sensing line acts as a sensing line and the first sensing line acts as a wordline and the first memory cell transistor M1 acts as a selection transistor.

A plurality of gate line sets WLP are arranged to cross over the active regions Act. A bitline contact DC is connected to the active region Act between the gate line sets WLP. A bitline BLx is electrically connected to two adjacent active regions Acti and Actj. As illustrated in the figure, the bitline BL is alternately connected to bitline contacts DC formed at two adjacent active regions, i.e., a first bitline contact DCi and a second bitline contact DCj. Accordingly, the bitline BL may extend in a zigzag configuration over the gate lines as shown.

Although not illustrated in the figure, impurity-doped layers may be formed at the active regions Act adjacent to opposite sides of the gate line sets WLP to be a source and a drain, respectively. In addition, the impurity-doped layer may be formed at the active region Act between the first gate line SL1 and the second gate line SL2 to be a floating diffusion layer.

According to the present invention, the active regions Act may be arranged at regular pitches with minimum feature size and the bitline BL is arranged in a zigzag configuration. Thus, the source and the drain may have the same structure without increasing the area of a cell array. As a result, increase of leakage current and resistance through a source region is lower than in a conventional non-volatile memory device where a common source line is formed.

As compared to the first embodiment, transistors connected to gate lines constituting a gate line set may all be memory cell transistors and thus a storage capacitance may be doubled.

Figure 5:
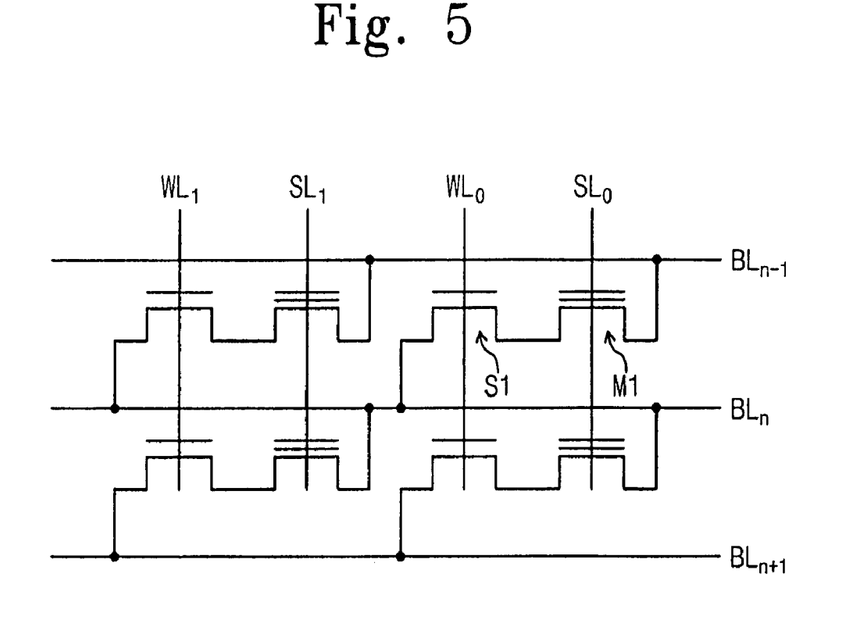
FIG. 5 is an equivalent circuit diagram illustrating a method of operating a non-volatile memory device according to an embodiment of the present invention.

FIG. 5 is an equivalent circuit diagram illustrating a method of operating a non-volatile memory device according to a first embodiment of the present invention.

Referring to FIG. 5, a memory cell transistor M1 and a selection transistor S1 are serially coupled between an nth bitline $BL_n$ and an (n+1)th bitline $BL_{n+1}$ (n being an integer smaller than 2 in this particular illustration). In a memory cell array, unit cells each comprising the memory cell transistor M1 and the selection transistor S1 are arranged in a row direction and a column direction to be connected to a sensing line $SL_n$, a wordline $WL_n$, and a bitline $BL_n$.

The memory cell transistors M1 and the selection transistors S1 are disposed at a P-well surrounded by an N-well. That is, a cell array of the non-volatile memory device may have the same configuration as a well in a cell array of a conventional non-volatile memory device.

The table <TABLE 1> shows bias conditions of the non-volatile memory device according to the first embodiment of the present invention.

TABLE 1

|  |  | $WL_n$ | $SL_n$ | $BL_{n-1}$ | $BL_n$ | $BL_{n+1}$ | P-well | N-well |
|---|---|---|---|---|---|---|---|---|
| Program | selected | Vpn | Vpp | Vpn | 0 | floating | Vpn | Vpp |
|  | unselected | Vpn | Vpp | 0 | 0 | floating | Vpn | Vpp |
| Erase | selected | 0 | Vnn | floating | floating | floating | Vnp | Vnp |
| Read | selected | Vpass | Vread | 0.5 | 0 | 0 | 0 | 0 |

* Vpn: negative program inhibit voltage
* Vnn: negative erase voltage
* Vpass: pass voltage
* Vpp: positive program voltage
* Vnp: positive erase voltage
* Vread: read voltage A method of operating a unit cell serially coupled between an (n−1)th bitline and an nth bitline will now be described with reference to the table <TABLE 1>.

In a program operation, a negative program inhibit voltage Vpn is applied to a wordline WLn to off a channel of a selection transistor S1. A positive program voltage Vpp is applied to a sensing line $SL_n$, and a negative program inhibit voltage Vpn is applied to a P-well and an (n−1)th bitline $BL_{n-1}$ to program negative charges into a charge storage of a selected memory cell transistor M1. At this point, a ground voltage is applied to an nth bitline $BL_n$ and an (n+1)th bitline $BL_{n+1}$ floats to inhibit an unselected memory cell transistor from being programmed.

In an erase operation, a ground voltage is applied to a wordline $WL_n$, a negative erase voltage is applied to a sensing line $SL_n$, and a positive erase voltage is applied to a P-well to erase negative charges stored in a charge storage of a selected memory cell. At this point, bitlines $BL_n$ float to suppress erase speed reduction caused by junction breakdown and leakage.

In a read operation, a pass voltage Vpass is applied to a wordline $WL_n$, a read voltage Vread is applied to a sensing line $SL_n$, and a reference voltage is applied to a selected bitline. While the reference voltage is 0.5 volt in this embodiment, it may be higher or lower than 0.5 volt. A voltage of 0 volt is applied to an unselected bitline and a P-well. The read voltage Vread is lower than a threshold voltage of a programmed memory cell and higher than a threshold voltage of an erased memory cell.

Figure 6:
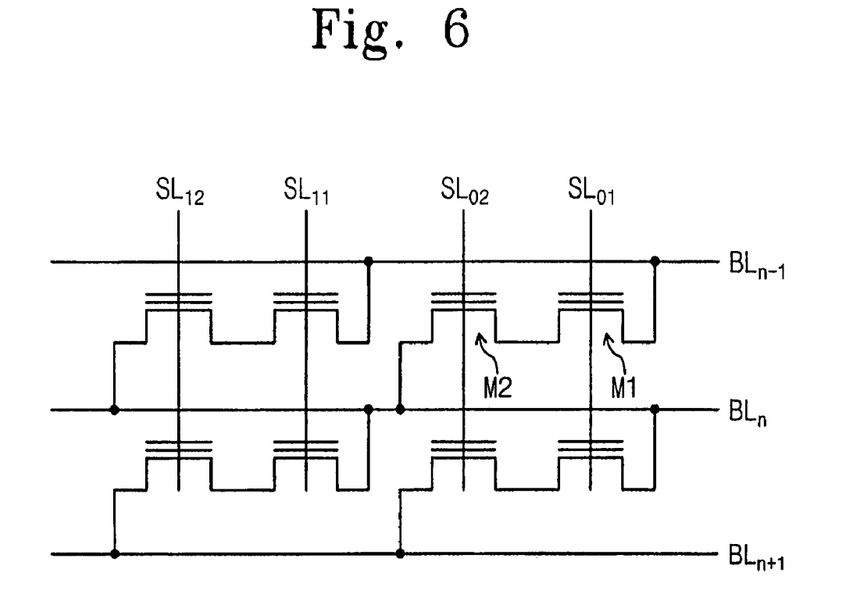
FIG. 6 is an equivalent circuit diagram illustrating a method of operating a non-volatile memory device according to another embodiment of the present invention.

FIG. 6 is an equivalent circuit diagram illustrating a method of operating a non-volatile memory device according to a second embodiment of the present invention.

Referring to FIG. 6, a first memory cell transistor M1 and a second memory cell transistor M2 are serially coupled between an nth bitline $BL_n$ and an (n+1)th bitline $BL_{n+1}$ (n being an integer smaller than 2 in this particular embodiment). In a memory cell array, unit cells each comprising the first memory cell transistor M1 and the second memory cell transistor M2 are arranged in a row direction and a column direction to be connected to a first sensing line $SL_{n1}$, a second sensing line $SL_{n2}$, and a bitline $BL_n$.

The first memory cell transistors M1 and the second memory cell transistors M2 are disposed at a P-well surrounded by an N-well. That is, a cell array of the non-volatile memory device may have the same configuration as a well in a cell array of a conventional non-volatile memory device.

The table <TABLE 2> shows bias conditions of the non-volatile memory device according to the second embodiment of the present invention.

A method of operating a unit cell serially coupled between an (n−1)th bitline and an nth bitline will now be described with reference to the table <TABLE 2>.

In a program operation of a first memory cell transistor M1, a negative program inhibit voltage Vpn is applied to a second sensing line $SL_{n2}$ to off a channel of a second memory cell transistor M2. A positive program voltage Vpp is applied to a first sensing line $SL_{n1}$ and a negative program inhibit voltage Vpn is applied to a P-well and an (n−1)th bitline $BL_{n-1}$ to program negative charges into a charge storage of the first memory cell transistor M1. At this point, a ground voltage is applied to an nth bitline $BL_n$ and an (n+1)th bitline $BL_{n+1}$ floats to inhibit an unselected memory cell transistor from being programmed.

In a program operation of the second memory cell transistor M2, a negative program inhibit voltage Vpn is applied to a first sensing line $SL_{n1}$ to off a channel of the first memory cell transistor M1. A positive program voltage Vpp is applied to a second sensing line $SL_{n2}$ and a negative program voltage Vpn is applied to the P-well and the nth bitline $BL_n$ to program negative charges into a charge storage of the selected second memory cell transistor M2. At this point, a ground voltage is applied to the nth bitline $BL_n$ and the (n+1)th bitline $BL_{n+1}$ floats to inhibit an unselected memory cell transistor from being programmed.

In an erase operation of the first memory cell transistor M1, a ground voltage is applied to the second sensing line $SL_{n2}$, a negative erase voltage is applied to the first sensing line $SL_{n1}$, and a positive erase voltage is applied to a P-well to erase negative charges stored in a charge storage of a selected memory cell. At this point, bitlines $BL_n$ float to suppress erase speed reduction caused by junction breakdown and leakage.

In an erase operation of the second memory cell transistor M2, a ground voltage is applied to the first sensing line $SL_{n1}$, a negative erase voltage is applied to the second sensing line $SL_{n2}$, and a positive erase voltage is applied to a P-well to erase negative charges stored in a charge storage of a selected memory cell. At this point, bitlines $BL_n$ float to suppress erase speed reduction caused by junction breakdown and leakage.

In a read operation of the first memory cell transistor M1, a pass voltage Vpass is applied to the second sensing line $SL_{n2}$, a read voltage Vread is applied to the first sensing line $SL_{n1}$, and a reference voltage is applied to a selected bitline $BL_{n-1}$. While the reference voltage is 0.5 volt in this embodiment, it may be higher or lower than 0.5 volt. A voltage of 0 volt is applied to unselected bitline $BL_n$ and $BL_{n+1}$ and a P-well. The read voltage Vread is lower than a threshold voltage of a programmed memory cell and higher than a threshold voltage of an erased memory cell.

TABLE 2

|  |  | $SL_{n1}$ | $SL_{n2}$ | $BL_{n-1}$ | $BL_n$ | $BL_{n+1}$ | P-well | N-well |
|---|---|---|---|---|---|---|---|---|
| Program | M1 | Vpp | Vpn | Vpn | 0 | floating | Vpn | Vpp |
|  | M2 | Vpn | Vpp | floating | Vpn | 0 | Vpn | Vpp |
| Erase | M1 | Vnn | 0 | floating | floating | floating | Vnp | Vnp |
|  | M2 | 0 | Vnn | floating | floating | floating | Vnp | Vnp |
| Read | M1 | Vread | Vpass | 0.5 | 0 | floating | 0 | 0 |
|  | M2 | Vpass | Vread | 0 | 0.5 | floating | 0 | 0 |

\* Vpn: negative program inhibit voltage
\* Vnn: negative erase voltage
\* Vpass: pass voltage
\* Vpp: positive program voltage
\* Vnp: positive erase voltage
\* Vread: read voltage In a read operation of the second memory cell transistor M2, a pass voltage Vpass is applied to the first sensing line $SL_{n1}$, a read voltage Vread is applied to the second sensing line $SL_{n2}$, and a reference voltage is applied to a selected bitline $BL_n$. A voltage of 0 volt is applied to unselected bitlines $BL_{n-1}$ and $BL_{n+1}$ and the P-well.

According to the invention, it is possible to form a non-volatile memory device including a 2-transistor 1-bit unit cell where a drain region and a source region of a memory cell have the same or similar structure. In addition, since a cell array of a non-volatile memory device according to the invention may include a 2-transistor 2-bit unit cell, a storage capacity of the non-volatile memory device may be doubled.

Although the present invention has been described in connection with the embodiment of the present invention illustrated in the accompanying drawings, it is not limited thereto. It will be apparent to those skilled in the art that various substitutions, modifications and changes may be made without departing from the scope and spirit of the invention.

What is claimed is:

1. A non-volatile memory device comprising:
a first transistor connected to an nth bitline; and
a second transistor connected to an (n+1)th bitline,
wherein the first and second transistors are serially coupled between the nth bitline and the (n+1)th bitline, and the first transistor and the second transistor are memory cell transistors.

2. The non-volatile memory device as set forth in claim 1, further comprising:
a first gate line connected to a gate electrode of the first transistor; and
a second gate line connected to a gate electrode of the second transistor,
wherein the first gate line and the second gate line are arranged to cross the nth bitline and the (n+1)th bitline and are parallel with each other.

3. The non-volatile memory device as set forth in claim 2, wherein the first gate line is connected to gate electrodes of first transistors connected to a plurality of bitlines, and
the second gate line is connected to gate electrodes of second transistors connected to a plurality of bitlines.

4. The non-volatile memory device as set forth in claim 1, wherein a plurality of first transistors and a plurality of second transistors are arranged between the nth bitline and the (n+1)th bitline.

5. The non-volatile memory device as set forth in claim 1, wherein the memory cell transistor comprises a data storage element having a charge trapping structure.

6. The non-volatile memory device as set forth in claim 1, wherein the memory cell transistor comprises a data storage element having a floating gate structure.

7. The non-volatile memory device as set forth in claim 1, wherein the first and second transistors are disposed at a first-conductivity-type well surrounded by a second-conductivity-type well.

8. A non-volatile memory device comprising:
a plurality of active regions extending on a semiconductor substrate in a column direction;
a plurality of gate line sets extending over the active regions in a row direction, the gate line sets each comprising a first gate line and a second gate line which are parallel with each other;
a data storage element interposed between the first gate line and the active region and between the second gate line and the active region;
bitline contacts each being formed at the active regions between the gate line sets; and
a plurality of bitlines, each of the bitlines crossing over the gate line sets and alternately connected to the bitline contacts formed at two adjacent active regions,
wherein the data storage element interposed between the first gate line and the active region and the data storage element between the second gate line and the active region are serially coupled between two adjacent bitlines.

9. The non-volatile memory device as set forth in claim 8, wherein the data storage element is a floating gate.

10. The non-volatile memory device as set forth in claim 8, wherein the data storage element is a charge trap insulator.

11. The non-volatile memory device as set forth in claim 8, wherein the bitline is zigzag-shaped.

12. A method of operating a non-volatile memory device comprising a first transistor connected to an nth bitline and a second transistor connected to an (n+1)th bitline, wherein the first and second transistors are serially coupled between the nth bitline and the (n+1)th bitline, and at least one of the first and second transistors is a memory cell transistor,
wherein a program method of the first transistor comprises:
applying a positive program voltage to a gate of the first transistor;
applying a negative program inhibit voltage to a gate of the second transistor;
applying a negative program voltage to the nth bitline;
floating the (n+1)th bitline; and
applying a negative program voltage to a substrate.

13. The method as set forth in claim 12, wherein a program method of the second transistor comprises:
applying a positive program voltage to a gate of the second transistor;
applying a negative program inhibit voltage to a gate of the first transistor;
applying a negative program voltage to the (n+1)th bitline;
floating the nth bitline; and
applying a negative program voltage to a substrate.

14. The method as set forth in claim 12, wherein a read method of the first transistor comprises:
applying a positive read voltage to the first transistor;
applying a positive pass voltage to the second transistor;
applying a reference voltage to the nth bitline; and
applying a ground voltage to the (n+1)th bitline.

15. The method as set forth in claim 12, wherein a read method of the second transistor comprises:
applying a positive read voltage to the second transistor;
applying a positive pass voltage to the first transistor;
applying a reference voltage to the (n+1)th bitline; and
applying a ground voltage to the nth bitline.

16. The method as set forth in claim 12, wherein a charge storage element is interposed between the substrate and the gate of the first transistor, and a gate insulator is interposed between the substrate and the gate of the second transistor.

17. The method as set forth in claim 12, wherein a charge storage element is interposed between the substrate and the gate of the first transistor and between the substrate and the gate of the second transistor.

* * * * *